United States Patent [19]
Maekawa

[11] Patent Number: 4,862,371
[45] Date of Patent: Aug. 29, 1989

[54] FAULT DIAGNOSIS SYSTEM FOR ELECTRONIC DEVICES ON AUTOMOBILES
[75] Inventor: Hirotoshi Maekawa, Himeji, Japan
[73] Assignee: Mitsubishi Denki Kabushiki Kaisha, Japan
[21] Appl. No.: 84,840
[22] Filed: Aug. 13, 1987
[30] Foreign Application Priority Data
  Aug. 18, 1986 [JP] Japan .................. 61-193121
[51] Int. Cl.$^4$ ............................. G06F 15/74
[52] U.S. Cl. .................. 364/431.11; 364/551.01; 371/11; 371/61; 123/486; 73/117.2
[58] Field of Search .............. 371/4, 20, 11, 16, 61; 364/431.11, 551.01; 73/117.2; 123/486

[56] References Cited
U.S. PATENT DOCUMENTS
4,245,315  1/1981  Barman et al. .................. 371/61
4,757,463  7/1988  Ballou et al. .................. 364/431.11

FOREIGN PATENT DOCUMENTS
5826648  7/1981  Japan .
5826649  7/1981  Japan .
5826650  7/1981  Japan .

Primary Examiner—Parshotam S. Lall
Assistant Examiner—Ellis B. Ramirez
Attorney, Agent, or Firm—Leydig, Voit & Mayer

[57] ABSTRACT

A fault diagnosis system for automotive electronic devices which are adapted to transmit their diagnosis data at different data transmission speeds peculiar thereto. The system has a memory device for storing transmission data concerning speeds of data transmission optimum for the respective electronic devices. The memory device also is capable of storing diagnosis data concerning the respective electronic devices. The diagnosis system also has a tester for reading, when connected selectively to one of the electronic devices, the data concerning the data transmission speed optimum for the selected electronic device from the memory device. The tester then forms a transmission reference clock reference signal on the basis of the read data. The tester is further adapted for exchanging data with the selected electronic device in accordance with the transmission reference clock signal and other stored data.

8 Claims, 1 Drawing Sheet

FAULT DIAGNOSIS SYSTEM FOR ELECTRONIC DEVICES ON AUTOMOBILES

BACKGROUND OF THE INVENTION

1. Field of the Invention

The present invention relates to a fault diagnosis system which permits easy fault diagnosis of various automotive electronic devices.

2. Description of the Prior Art

A fault diagnosis system has been known in which data is transmitted from an electronic device on an automobile to a fault detecting means such as a tester. This type of diagnosis system has been proposed by Owatonna Tool Company, U.S.A. In this diagnosis system, the speed of transmission of data from the electronic device to the tester is determined beforehand, and the transfer of the data is conducted in response to a reference signal which is sent from the tester to the electronic device.

The basic construction of this known fault diagnosis system is shown in a block diagram in FIG. 1. An electronic device 1 and a tester 3 are connected to each other through a fault diagnosis connector 2. The electronic device 1 and the tester 3 are equipped with microcomputers 1a and 3b, respectively. The fault diagnosis connector 2 is connected both to the electronic device 1 and the tester 3, through various lines which include a transmission reference clock line 4 for a transmission reference clock signal, data lines 5, 6 for transmitting data such as items to be checked, and a transmission reference line 7 connected to a transmission reference point (GND). The transmission reference clock signal is produced in synchronization with an oscillation signal from an oscillator 3a. The portions of the data lines 5 and 6 in the electronic device 1 and in the tester 3 are provided with rectifier elements 1d and 3d, respectively, in order to prevent reversing of currents carrying the data.

The operation of the fault diagnosis system shown in FIG. 1 is as follows. In order to check the electronic device 1, a transmission reference clock signal is formed in the tester 3 in synchronization with an oscillation output from the oscillator 3a in the tester 3, and the thus formed transmission reference clock signal is transmitted through the transmission reference clock line 4 to the electronic device 1 to be checked. In consequence, the speed of data transmission from the electronic device is fixed to the same speed as the operation of the tester 3. In other words, the transmission of data from the electronic device 1 is synchronized with the operation of the tester 3, thus enabling the tester to conduct a fault diagnosis on the electronic device 1. This known fault diagnosis system is advantageous in that as long as electronic device to be checked has a serial transmission function as hardware thereof, there need not be any internal means for generating a reference clock.

Unfortunately, however, this diagnosis system cannot be applied to electronic devices which are not equipped with a serial transmission function. Therefore, when this apparatus is used in fault diagnosis of electronic devices having no serial transmission function, it is often necessary to carry out the serial transmission by a suitable port control by means of software. In such a case, the time of execution of the main program is used as the reference speed for the data transmission.

Another problem of this known fault diagnosis system is that the transmission reference clock line 4 is required in addition to the data lines 5 and 6, with the result that the adaptability of the diagnosis system to a variety of electronic devices is limited.

SUMMARY OF THE INVENTION

Accordingly, an object of the present invention is to provide a fault diagnosis system for electronic devices on automobiles, capable of conducting fault diagnosis even on such electronic devices as having no means of serial data transmission, and which is widely adaptable and can be more freely utilized with respect to electronic devices, thereby overcoming the above-described problems of the prior art.

To this end, the fault diagnosis system of the present invention for automotive electronic devices has a memory device annexed to a tester for storing optimum data transmission speeds for the respective electronic devices on an automobile.

More specifically, according to the present invention, there is provided a fault diagnosis system for electronic devices on automobiles comprising: memory means for storing transmission data concerning speeds of data transmission optimum for the respective electronic devices which are adapted to transmit their diagnosis data at different data transmission speeds peculiar thereto, the memory means also being capable of storing diagnosis data concerning the respective electronic devices; tester means for reading, when connected selectively to one of the electronic devices, the data concerning the data transmission speed optimum for the selected electronic device from the memory means and for forming a transmission reference clock signal, the tester means being further adapted for exchanging data with the selected electronic device in accordance with the transmission reference clock signal and other stored data; and a fault diagnosis connector for connecting the tester to one of the electronic devices.

In use, the operator selects one of the electronic devices on an automobile. The diagnosis system then computes, from the data stored in the memory device, the data transmission speed optimum for the selected electronic device, and forms a transmission reference clock signal on the basis of the thus computed optimum data transmission speed. The system then conducts the fault diagnosis on the selected electronic device by making use of the thus formed transmission reference clock signal.

The above and other objects, features and advantages of the present invention will become clear from the following description of the preferred embodiment when the same is read in conjunction with the accompanying drawings.

DESCRIPTION OF THE PREFERRED EMBODIMENT

Figure 1:
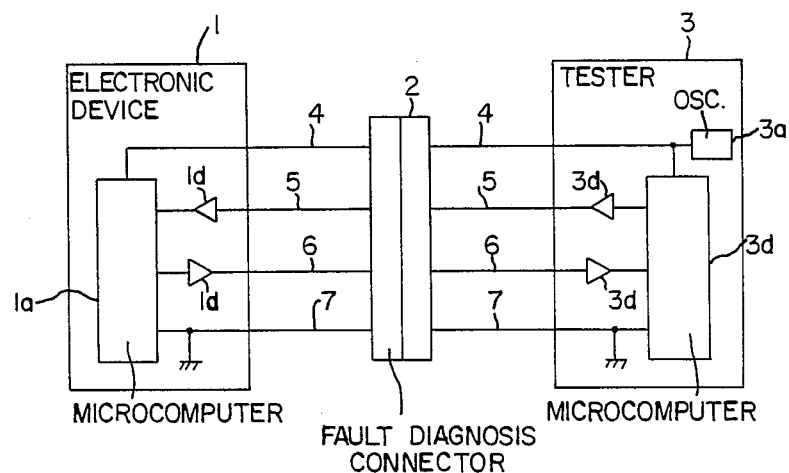
FIG. 1 is a block diagram of a known fault diagnosis system for automotive electronic devices.
Figure 2:
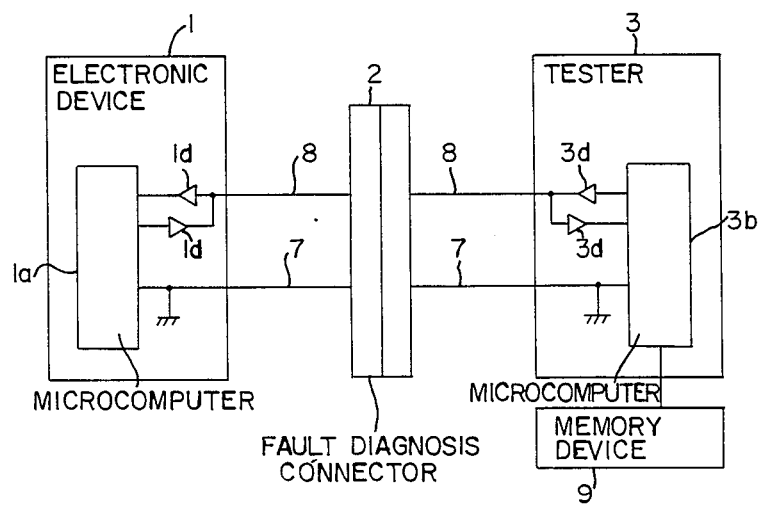
FIG. 2 is a fault diagnosis system of the invention for automotive electronic devices.

FIG. 2 is a block diagram showing the basis arrangement of a fault diagnosis system embodying the present invention. In this Figure, the same reference numerals are used to denote the same parts or members as those appearing in FIG. 1.

From the comparison between FIGS. 1 and 2, it will be understood that the tester 3 in the fault diagnosis system of the present invention shown in FIG. 2 is devoid of the oscillator 3a which is essentially incorporated in the conventional system shown in FIG. 1. This in turn eliminates the necessity for the transmission reference clock line 4. According to the invention, therefore, each electronic device can be examined at the data transmission speed optimum for the device. In the fault diagnosis system of the present invention, a memory device 9 is annexed to the tester 3. The memory device 9 is adapted for storing data concerning optimum data transmission speeds for the respective electronic devices, and is constructed as a unit which is separate from the tester. The contents of the memory device 9 may be renewed for yearly model changes, so that the most up-to-date data concerning data transmission speed is available ensuring that the fault diagnosis system of the present invention can be used for many years.

A transmission reference line 7 and a data transmission line 8 for transmitting data such as the diagnosis item to be diagnosed are connected between the electronic device 1 to be examined and a fault diagnosis connector 2 and also between the fault diagnosis detector 2 and the tester 3.

In operation, the user of the fault diagnosis system selects one of the electronic devices by a suitable means, so that the data concerning the data transmission speed optimum for the selected electronic device is read from the memory device 9 and is delivered to the tester 3. The thus read data is converted into a signal suitable for counting by a counter (not shown) in the tester and a clock signal is formed in accordance with the signal counted by the counter. Then, the transfer of data between the electronic device and the tester 3 is conducted in synchronism with the thus formed clock signal.

The clock formed in the tester is then frequency divided or demultiplied into 1/16 ths within the tester 3. Then, the data is exchanged through the line 8 between the tester 3 and the electronic device 1 which also has an oscillation source demultiplied into 1/16 ths.

The data signal itself is formulated in accordance with a predetermined rule such as that specified in JIS (Japanese Industrial Standards) and various other conditions for the data transmission are also determined beforehand for the respective electronic devices which are to be examined and stored in the memory device 9. In this embodiment, the diagnosis data is exchanged through a single bi-directional data line 8 so that the fault diagnosis system of this embodiment is widely adaptable and more freely utilized with respect to the electronic devices, without requiring laborious work for connecting many lines.

In the described embodiment, the adaptability of the fault diagnosis system is improved by virtue of the use of the memory device 9 which stores data concerning the speeds of the data transmission between the electronic devices 1 and the tester 3 optimum for the respective electronic devices. According to the invention, however, the memory device 9 can store other types of data such as the items involving faults, formulae for converting physical amounts, communication rules and so forth. In such a case, fault diagnosis can be conducted on various types of electronic devices by using a single memory device.

As has been described, the fault diagnosis system in accordance with the present invention for automotive electronic devices is provided with a memory device annexed to the tester and adapted for storing data concerning speeds of data transmission optimum for the respective electronic devices which are to be examined. When the user selects one of the electronic devices by way of the tester, the data transmission speed optimum for the selected electronic device is read from the memory device 9 and delivered to the tester. The tester then forms a reference clock on the basis of the thus read data representing the optimum data transmission speed. In consequence, fault diagnosis can be conducted on various electronic devices without unnecessarily burdening the electronic devices to be examined, because the memory device annexed to the tester provides data necessary for transmission between the tester and various types of electronic devices.

It is thus possible to realize a fault diagnosis system which is widely adaptable and which can be freely utilized with respect to electronic devices on automobiles.

What is claimed is:

1. A fault diagnosis system for electronic devices on automobiles wherein respective electronic devices are adapted to transmit diagnosis data at different data transmission speeds peculiar thereto, the system comprising:

memory means for storing transmission data concerning speeds of data transmission optimum for the respective electronic devices and for writably storing diagnosis data concerning the respective electronic devices;

fault detecting means for reading, when connected selectively to one of said electronic devices, the transmission data concerning the data transmission speed optimum for the selected electronic device from said memory means; for forming a transmission reference clock signal; for exchanging data with said selected electronic device in accordance with said transmission reference clock signal and other stored data; and for storing diagnosis data received from the selected electronic device in the memory means; and a fault diagnosis connector connected between said fault detecting means and one of said electronic devices.

2. A fault diagnosis system according to claim 1 wherein said memory means further includes means for storing of data exchange between said electronic devices and said tester, items involving faults, and formulae for converting physical amounts.

3. A fault diagnosis system according to claim 1 wherein the memory means includes a memory device.

4. A fault diagnosis system according to claim 3 wherein the memory device includes a semiconductor memory device.

5. A fault diagnosis system according to claim 4 wherein the semiconductor memory device includes a random access memory.

6. A fault diagnosis system according to claim 1 wherein the fault detecting means includes a tester, 7. A fault diagnosis system according to claim 6 wherein the tester includes a microcomputer.

8. A fault diagnosis system according to claim 1 further comprising a transmission reference line connected from the selected electronic device through the fault diagnosis connector to the fault detecting means.

* * * * *